(12) United States Patent
Perenzoni

(10) Patent No.: US 12,094,911 B2
(45) Date of Patent: Sep. 17, 2024

(54) HIGH SPATIAL RESOLUTION SOLID-STATE IMAGE SENSOR WITH DISTRIBUTED PHOTOMULTIPLIER

(71) Applicant: Fondazione Bruno Kessler, Trento (IT)

(72) Inventor: Matteo Perenzoni, Rovereto (IT)

(73) Assignee: Fondazione Bruno Kessler, Trento (IT)

( * ) Notice: Subject to any disclaimer, the term of this patent is extended or adjusted under 35 U.S.C. 154(b) by 0 days.

(21) Appl. No.: 17/611,505

(22) PCT Filed: Apr. 23, 2020

(86) PCT No.: PCT/IB2020/053856
§ 371 (c)(1),
(2) Date: Nov. 15, 2021

(87) PCT Pub. No.: WO2020/240302
PCT Pub. Date: Dec. 3, 2020

(65) Prior Publication Data
US 2022/0208825 A1 Jun. 30, 2022

(30) Foreign Application Priority Data
May 24, 2019 (IT) .................. 102019000007225

(51) Int. Cl.
*H01L 27/146* (2006.01)
*G01S 17/894* (2020.01)
*H01L 31/107* (2006.01)

(52) U.S. Cl.
CPC ...... *H01L 27/14643* (2013.01); *G01S 17/894* (2020.01); *H01L 31/107* (2013.01)

(58) Field of Classification Search
CPC ............. H01L 27/14643; H01L 31/107; G01S 17/894
See application file for complete search history.

(56) References Cited

U.S. PATENT DOCUMENTS 10,024,979 B1 * 7/2018 Viswanath .............. G01T 1/172
2006/0202121 A1 9/2006 Charbon et al.
(Continued)

FOREIGN PATENT DOCUMENTS

| EP | 2 469 294 A1 | 6/2012 |
| EP | 2 708 913 A1 | 3/2014 |
| EP | 3 318 895 A1 | 5/2018 |

OTHER PUBLICATIONS

International Search Report and Written Opinion dated Jun. 16, 2020, issued in PCT Application No. PCT/IB2020/053856, filed Apr. 23, 2020.

*Primary Examiner* — Thanh Luu
(74) *Attorney, Agent, or Firm* — Workman Nydegger

(57) ABSTRACT

A solid-state image sensor for detecting one or more photons includes a plurality of pixels sensitive to such photons, each of the pixels having a logic unit and an avalanche photodiode operatively connected to the logic unit, the logic unit being configured to provide an electrical signal different from the electrical signals provided by the logic units of the remaining pixels. The logic unit of each of the pixels is operatively connected to the logic unit of an adjacent pixel, such logic unit outputting the electrical signal when the avalanche photodiode belonging to the same pixel and the avalanche photodiode belonging to such adjacent pixel each detect at least one photon within a time window.

9 Claims, 3 Drawing Sheets

(56) References Cited

U.S. PATENT DOCUMENTS

| | | | |
|---|---|---|---|
| 2015/0296161 A1* | 10/2015 | Saito | H01L 31/107 |
| | | | 250/369 |
| 2017/0163917 A1* | 6/2017 | Yamada | H04N 23/667 |
| 2018/0225521 A1* | 8/2018 | Harris | G01T 1/171 |
| 2019/0250257 A1* | 8/2019 | Finkelstein | G01S 17/931 |

* cited by examiner

HIGH SPATIAL RESOLUTION SOLID-STATE IMAGE SENSOR WITH DISTRIBUTED PHOTOMULTIPLIER

BACKGROUND OF THE INVENTION

1. The Field of the Invention

The present invention concerns a high spatial resolution solid-state image sensor with distributed photomultiplier which enables to determine precisely the impact position and instant of one or more photons on the sensitive surface of the aforesaid device.

The invention also concerns the method for managing such high spatial resolution image sensor of the invention which enables to determine precisely said impact position.

Furthermore, the invention concerns the method of detecting one or more photons by means of the high spatial resolution image sensor of the invention.

2. The Relevant Technology

It is known that in the field of measuring the distance by means of the time of flight of the light it is required to establish the instant of arrival time of a photon beam.

They are in fact known devices for measuring the distance that are based on the emission of a light radiation directed towards a concerned object and on the detection of the aforesaid light radiation returning from the concerned object itself.

In detail, such measuring devices comprise means for emitting such light radiation and reception means comprising an area that is sensitive to such light radiation. Measuring devices further comprise a processing unit able to determine, directly or indirectly, the time interval between the emission of such light radiation by emitting means and detection thereof by reception means.

The value of the aforesaid time interval, known in the technical jargon as "Time of Flight", ToF, and usually referred to photons belonging to the aforesaid light radiation, is directly proportional to the distance between the measuring device and the concerned object.

In this regard, the processing unit of the known measuring devices is usually configured to determine the value of such distance from the ToF. Incidentally, it is important to note that the expression "photons belonging to the aforesaid light radiation" means to indicate only and exclusively photons generated by the aforesaid emitting means, distinct therefore from photons resulting from background radiation, i.e., resulting from ambient light.

From an implementation perspective, in order to enable detecting distance images it is necessary to use image sensors which have high resolution and few problems, if none at all, of sensitivity to intrinsic and/or external interferences.

Such image sensors comprise a plurality of photosensitive micro-cells, known in the technical jargon as "pixels", usually arranged as an array on a single semiconductor substrate. Each of the aforesaid pixels, in the single-photon implementations, comprises a reverse biased avalanche photodiode, also known as SPAD (Single-Photon Avalanche Diode), with responds independently from the others by emitting an elemental charge pack upon detection of a photon.

One first type of image sensor provides that each photosensitive micro-cell comprises a processing unit, operatively connected to the avalanche photodiode, configured to acquire as input the aforesaid charge pack generated by the avalanche photodiode and output an electric signal which represents the aforesaid ToF related to the single photosensitive micro-cell.

In other words, with such first type of image sensor, each pixel outputs an electrical signal independent from the other pixels and related to the ToF of the photon detected by the same pixel.

Such electrical signals generated by the plurality of pixels are subsequently input to a specific electronic circuit that is external to the image sensor able to process such electrical signals and determine, for example, the measured distance.

However, such type of image sensors has an acknowledged drawback consisting in that the electrical signals generated by each single pixel, being the latter independent from the remaining pixels, are inter-related. Disadvantageously, this leads to the fact that each one of such pixels can generate an electrical signal and output it even in case the photon detected and which determined such generation is a background photon not belonging to the light beam to be actually detected.

Substantially, in such type of image sensors a statistical noise in the distribution of the detected photons is observed due to the fact that the detection of the photons of a flash of light is a casual Poisson-type first-order approximation process superimposed to a background of background photons. This noise, disadvantageously, causes a reduction in precision, accuracy and strength of the distance measure of the same image sensors.

More simply, such type of image sensors is not able to distinguish an event due to the detection of a photon actually belonging to the light beam to be measured from a photon belonging to the background.

To overcome such drawback, a second type of image sensors was developed, always comprising a plurality of pixels, but containing in this case more avalanche photodiodes connected between each other so as to provide a single signal proportional to the number of activated photodiodes, and therefore proportional to the number of detected photons, in a determined time window which starts when the first photon is detected. Such type of image sensors allows to put in relation the photons received within the aforesaid time window, discarding those which are not related and which thus probably belong to the background. The arrival time of the selected photons is thus measured and subsequently a signal proportional to the ToF is made available as an output to the image sensor.

Such electric signal does not need to be further filtered, as in the case of the first-type image sensor, for determining the searched measure.

However, even this second type of image sensors has an acknowledged drawback hereinafter presented.

Disadvantageously, in fact, as each pixel contains a plurality of avalanche photodiodes and relative control electronics, in order to increase Ie spatial resolution of such image sensor it is necessary to increase the sensitive surface of the device itself.

Document EP2708913 describes a sensor that has a light receiver comprising a group of avalanche photodiode elements for detection of light received from a monitored area. A group evaluation unit is connected with the photodiode elements to receive a reception signal and determines an event as detection of the received light only when a minimum number of the photodiode elements simultaneously generate the reception signal within an allowable time interval.

Document EP3318895 describes a device for receiving a reflected light pulse in a lidar system, comprising a sensor array which comprises a plurality of individual sensor elements which are set up to detect light pulses and a selection circuit, which is set up to select some of the sensor elements and combine them into a macropixel.

Document EP2469294 relates generally to methods and devices of generating an electrical representation of at least one object in a scene in the real world. The detail real-time imager for the representation of a scene of a real world comprises: at least an illuminator of said scene providing at least a series of ultrashort power laser pulses with time-related positions; and a receiver of a SPAD Single Photon Avalanche Diode detector array according to the method of the invention and associated to at least said series of ultra-short power laser pulses of said illuminator.

US2006202121 describes a transducer for reading information stored in an optical record carrier, comprising at least one solid-state single photon detector, for example a single photon avalanche diode for acquisition of a 2D or 3D image of at least a portion of the optical record carrier.

SUMMARY OF THE INVENTION

The present invention intends to overcome all the mentioned drawbacks.

In particular, it is the object of the invention to realise an image sensor capable to ensure a higher spatial resolution than the image sensors of the known art being the physical dimensions of the sensitive surfaces of the same sensors equal.

A further object of the invention is to realise an image sensor with a high spatial resolution and at the same time of simple construction and management, being able to relate the photon arrivals in a time window.

The aforesaid objects are achieved by realising an image sensor according to the main claim.

Further characteristics of the image sensor of the invention are described in the dependent claims.

Such objects are also reached by the method for managing such image sensor as disclosed herein and by the method of detecting one or more photons by the use of the image sensor of the invention as disclosed herein.

BRIEF DESCRIPTION OF THE DRAWINGS

The aforesaid objects, together with the advantages that will be mentioned hereinafter, will be highlighted during the description of a preferred embodiment of the invention, which is given by way of non-limiting example with reference to the attached drawings, where.

DETAILED DESCRIPTION OF THE PREFERRED EMBODIMENTS

Figure 1:
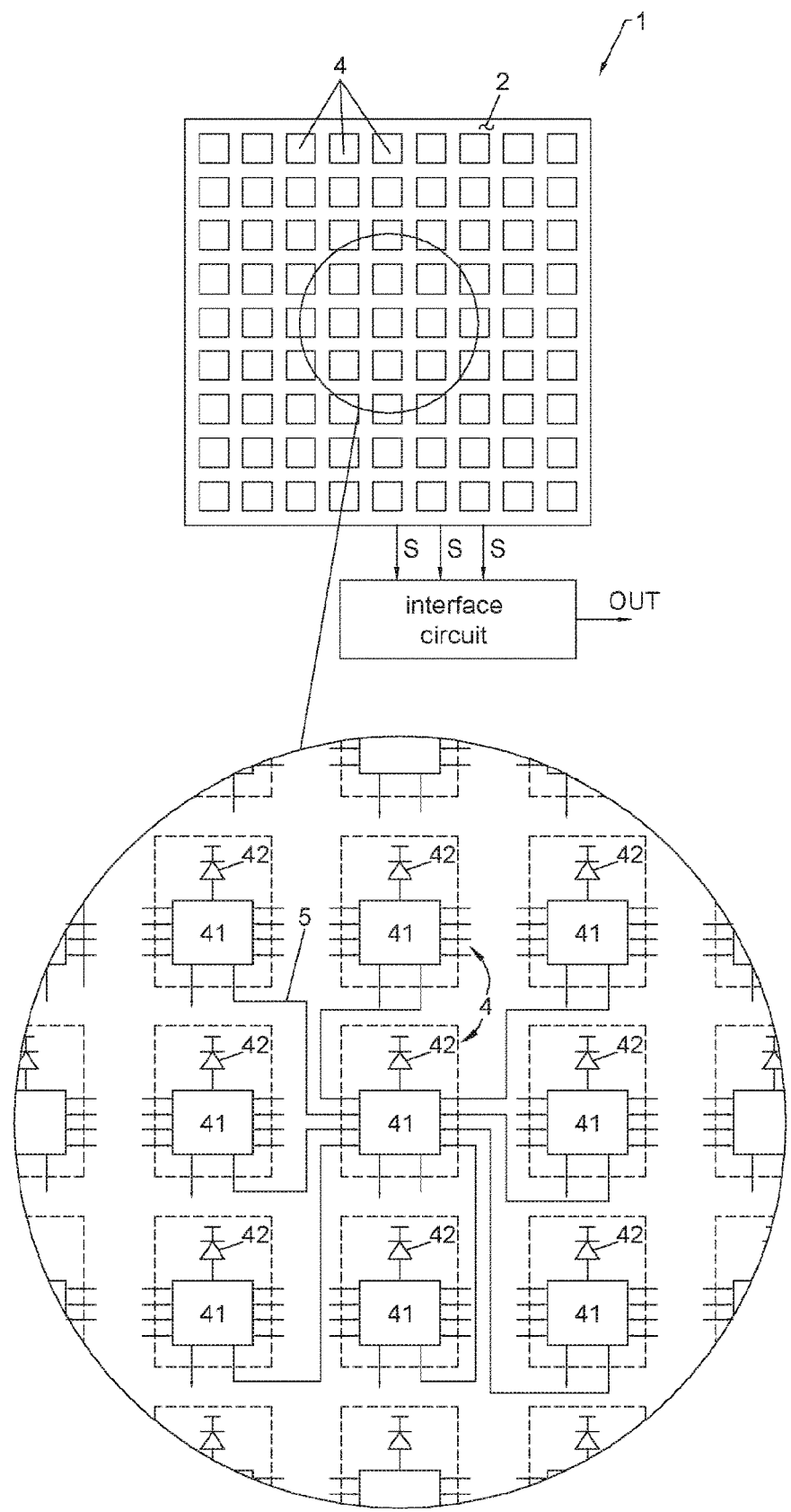
in FIG. 1 an image sensor of the invention and the detail of the connection diagram of adjacent pixels belonging to such image sensor are represented in view from above.

The solid-state image sensor of the invention for detecting one or more photons is represented in its entirety, according to a preferred embodiment, in FIG. 1, where it is indicated by 1.

The image sensor 1 of the invention, according to such preferred embodiment, comprises a plurality of pixels 4 sensitive to the aforesaid photons, where such pixels 4 are arranged as an array such to determine a plurality of columns along a first direction X and a plurality of lines along a second direction Y.

However, it is not excluded that in different embodiments of the invention such pixels 4 are arranged such to define a single-dimensional array which extends exclusively along the aforesaid first direction X or exclusively along the aforesaid second direction Y.

Figure 2:
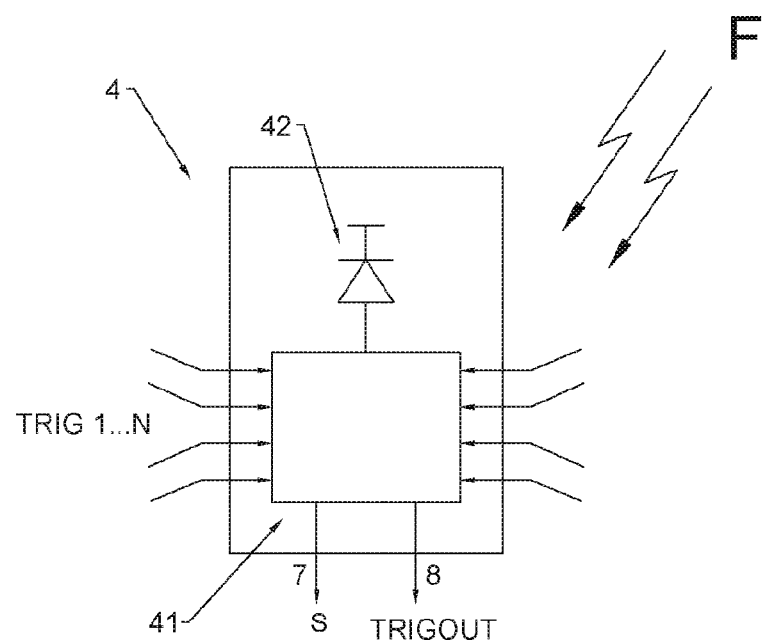
in FIG. 2 a single pixel belonging to the image sensor of FIG. 1 is schematically represented.

As it can be observed in FIG. 2, each pixel 4 comprises a logic unit 41 and an avalanche photodiode or SPAD 42 operatively connected to the aforesaid logic unit 41.

According to the preferred embodiment of the invention, such logic unit 41 and the relative avalanche photodiode or SPAD 42 are made on a single semiconductor substrate 3 belonging to said image sensor 1.

However, it is not excluded that according to an executive variant the image sensor 1 comprises two semiconductor layers 3 superimposed on each other in a vertical direction, where the aforesaid avalanche photodiodes 42 are made on the more external semiconductor substrate while the logic units 41 are defined on the more internal semiconductor substrate, as long as each logic unit 41 of a pixel 4 is operatively connected to the avalanche photodiode 42 of the same pixel 4.

Such logic unit 41 of each pixel 4 is configured to output to the image sensor 1 through a specific output channel 7 a signal S relative to the captured information, containing for example the number of photons and/or the arrival time. Such information being output from such output channel 7 will be provided to the interface peripheral circuit. The interface circuit has an output OUT which enables to multiplex the output channels 7 of all the pixels 4.

Each pixel 4 also generates, by means of an output channel 8, an electrical signal TRIGOUT different from the electrical signals TRIGOUT generated and output by the remaining pixels 4 belonging to the same image sensor 1. Such TRIGOUT signal corresponds to the detection carried out by the avalanche photodiode 42 of a single pixel 4 of at least a photon F.

According to alternative embodiments of the invention, each pixel 4 might comprise two or more avalanche photodiodes 42 connected to the same logic unit 41 of the same pixel 4 according to an "OR"-type logic, thereby the logic unit 41 is configured to output the signal S and the electrical signal TRIGOUT when at least an avalanche photodiode 42 detects a photon F, or, in alternative, according to an "AND"-type logic, thereby such signal S and such electrical signal TRIGOUT are output when all the aforesaid avalanche photodiodes 42 of the same pixel 4 detect a photon F.

Figure 4:
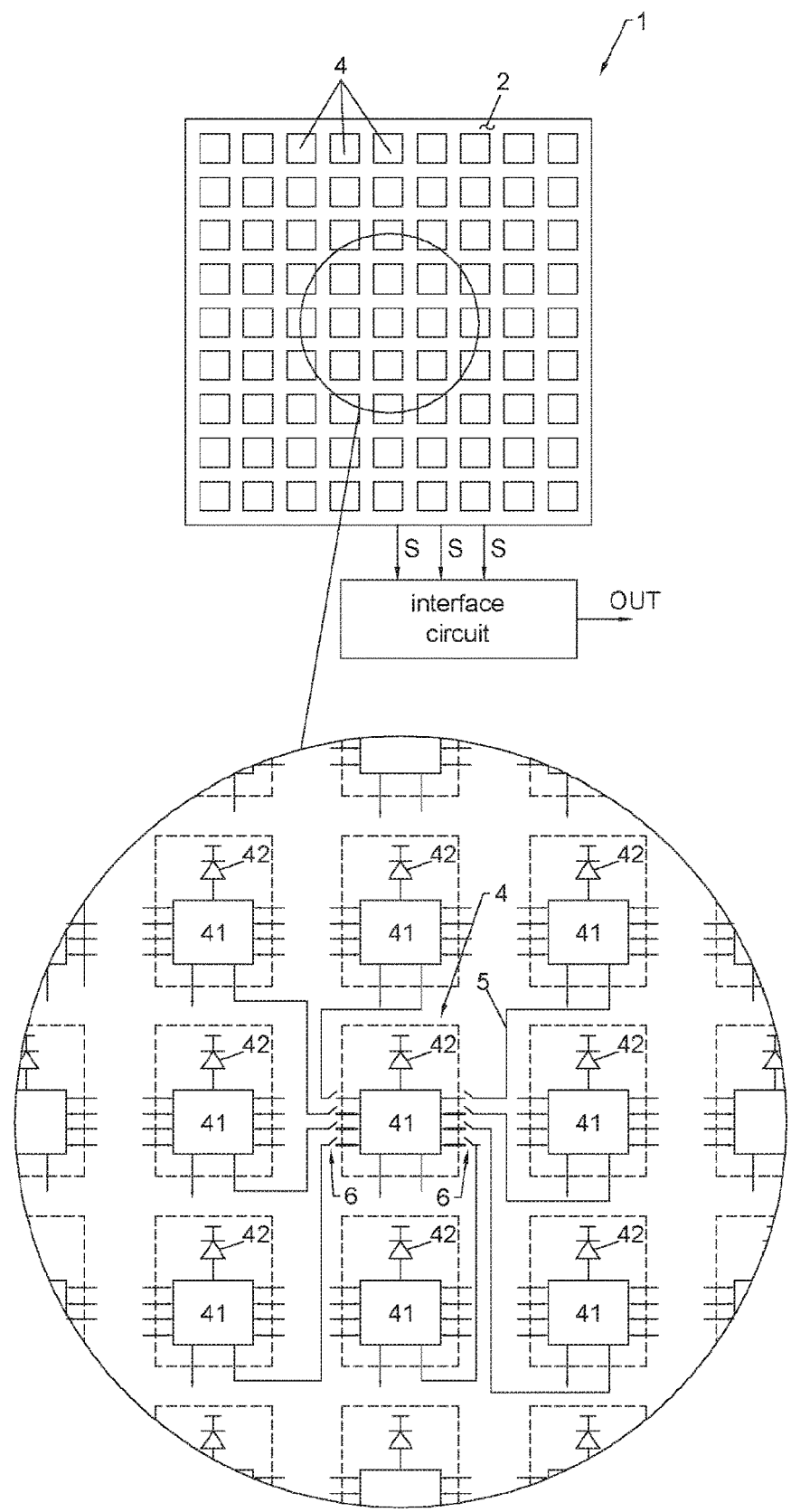
in FIG. 4 the connection diagram of adjacent pixels belonging to the image sensor of the invention is represented according to an executive variant with respect to the first preferred embodiment of FIG. 1.

According to two embodiments of the invention, respectively represented in FIGS. 1 and 4, the logic unit 41 of each pixel 4 is operatively connected also to the logic units 41 of the eight pixels 4 adjacent to the aforesaid pixel 4 which such logic unit 41 belongs to.

The logic unit 41 is configured to confirm and store information of the number of photons and/or the arrival time and finally output the aforesaid electrical signal S when the number of logic units 41, operatively connected to the same logic unit 41, which detect at least a photon F within a predefined time window $W_T$, which starts when the photon is detected by the avalanche photodiode 42 connected to the aforesaid logic unit 41, is higher than or equal to a pre-established minimum number n.

For example, in the case of the aforesaid preferred embodiment of the invention, which thus provides the operative connection of the logic unit 41 of each pixel 4 with its avalanche photodiode 42 and with the eight logic units 41 of the adjacent pixels 4, the pre-established minimum number n might be of four. Therefore, such logic unit 41 would confirm and store information of the number of photons and/or the arrival time detected by the concerned pixel 4 and would output such electrical signal S only and exclusively if the number of pixels 4, comprising the concerned pixel 4 and the eight adjacent pixels 4, that detect at least a photon F in the aforesaid time window $W_T$ was four or higher. Such last event is represented in FIG. 3a.

Figures 3A, 3B:
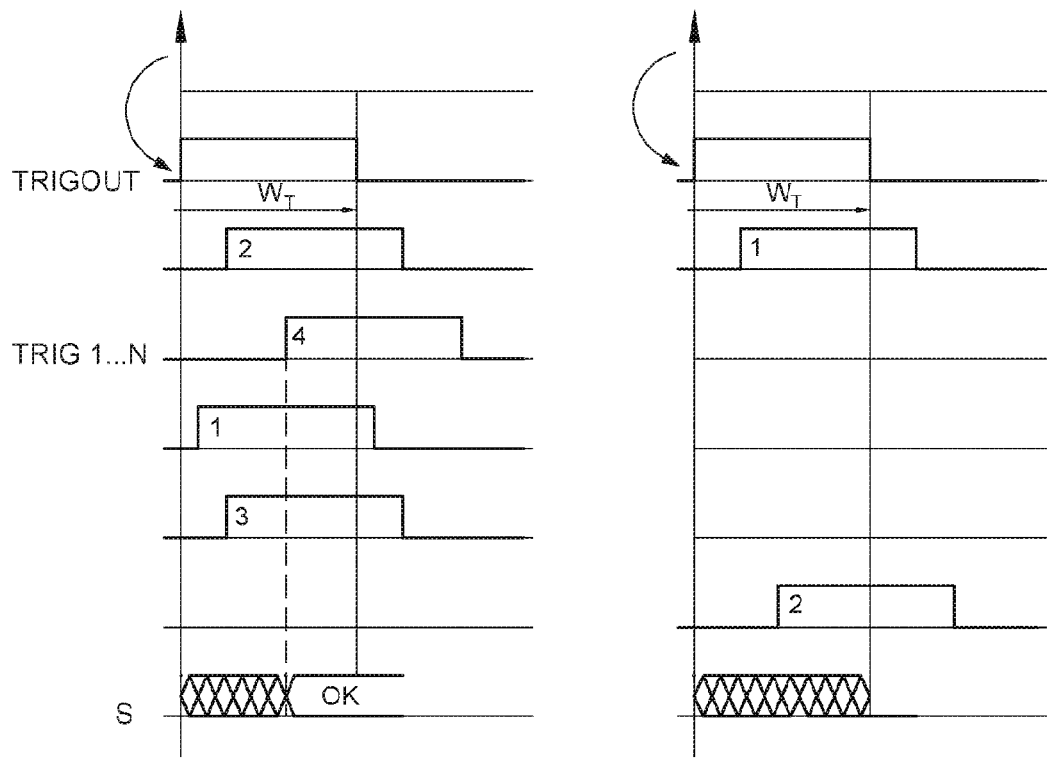
FIGS. 3a and 3b represent two time diagrams of signals involved in the detection of one or more photons by means of the image sensor of the invention.

FIG. 3b represents by contrast the case wherein the pre-established minimum number of pixels detecting at least a photon F is not reached. Consequently, in this case, at the end of the time window $W_T$, the logic unit 41 does not output any electrical signal S.

It is important to note that, according to the preferred embodiment of the invention, the information on the time arrival of the concerned pixel 4 is only related to the photon/s captured by its avalanche photodiode 42 and that the adjacent pixels 4 only represent a validation element, which enables to actually keep the spatial resolution at pixel level without realizing a spatial average.

However, it is not excluded that according to executive variants of the invention the logic unit 41 of each pixel 4 can be connected to a number other than eight of adjacent and not adjacent logic units 41 of the pixels 4.

Returning to the preferred embodiment of the invention, as represented in FIG. 1, the connection between the aforesaid logic unit 41 of each pixel 4 with the logic units 41 of the adjacent pixels 4 is a permanent electrical connection.

However, it is not excluded that according to an alternative executive variant of the invention, represented in FIG. 4, such operative connection between each pair of the aforesaid logic units 41 is made by means of a conductive track 5 and a switching element 6 configured to electrically connect or electrically disconnect each of the aforesaid pair of logic units 41.

Such configuration allows to dynamically select which logic units 41 of adjacent pixels 4 are actually to be electrically connected to the logic unit 41 of each of the pixels 4 while using the image sensor 1 of the invention.

Thus, executive variants of the device of the invention may provide to operatively connect by means of the aforesaid conductive track 5 and the aforesaid switching element 6 the logic unit 41 of each of the pixels 4 not only with the logic units 41 of adjacent pixels 4, but also to the logic units 41 of other pixels 4 belonging to the same image sensor 1.

The extreme case may provide that the logic unit 41 of each pixel 4 is operatively connected by means of the aforesaid conductive track 5 and the aforesaid switching element 6 to the logic units 41 of all the remaining pixels 4 belonging to the same image sensor 1 of the invention.

In these last cases, as will be hereinafter described, before providing the use of the image sensor 1 of the invention, it is necessary to set for each pixel 4 by means of relative switching elements 6 which logic units 41 of the other pixels 4 must be electrically connected to the logic unit 41 of the aforesaid pixel 4.

Advantageously, this executive variant allows to dynamically modulate the architecture of the image sensor 1 of the invention based on the use needs.

Returning to the preferred embodiment of the invention herein described and represented in the enclosed drawings, the electric signal S output by the logic unit 41 of each pixel 4 corresponds to the arrival time of the photon F detected by the avalanche photodiode 42 belonging to the same pixel 4 of such logic unit 41.

In this case therefore, advantageously, the logic unit 41 of each pixel 4 is configured to use the connection with the logic units 41 of the adjacent pixels 4 only to verify if actually the photon F detected by its own avalanche photodiode 42 is a photon belonging to the light beam to be detected or if it is a background photon, taking advantage of the fact that it is highly probable that an object that is observed at a certain distance can be framed by more adjacent pixels 4. Such verification, as previously seen, is carried out according to the invention by checking if a predefined minimum number n of the other avalanche photodiodes 42 also detected a photon within the aforesaid time window $W_T$.

However, the output signal S relates only and exclusively to the datum of the photon F detected or of the photons F detected by the avalanche photodiode 42 belonging to the same pixel 4 of the specific logic unit 41, obviously only if such verification is successful.

However, it is not excluded that according to an alternative executive variant such signal output by the logic unit 41 of each pixel 4 is proportional to the number of photons F detected within the aforesaid time window $W_T$ by the avalanche photodiode 42 of the aforesaid logic unit 41.

Further, it is not excluded that according to a further executive variant such signal output by the logic unit 41 of each pixel 4 is proportional to the number of photons F detected within the aforesaid time window $W_T$ by all the avalanche photodiodes 42 of all the logic units 41 connected to the same logic unit 41 of the concerned pixel 4.

The implementation of the image sensor 1 of the invention, according to the preferred embodiment of the invention including all the executive variants above described, clearly allows to obtain a number of data already validated and therefore already usable, that is much higher than the image sensors of the known art, in that each photosensitive microcell is able to provide a datum, for example the ToF of the photon detected, but, unlike the first type of image sensors of the previously described prior art, such datum will be provided only and exclusively if one or more of the adjacent pixels 4 also detected a photon F within a predefined time window $W_T$.

In other words, such implementation and such approach allow to increase the spatial resolution of the image sensor 1, being the number of pixels 4 and the size of the whole sensitive surface 2 equal.

As previously mentioned, part of the invention is also the method for managing the image sensor 1 of the invention, in case it provides that the operative connection between the logic unit 41 of each one of the pixels 4 and one or more of the logic units 41 of the pixels 4 adjacent or not is made by means of the aforesaid conductive track 5 and the aforesaid switching element 6.

Such method provides in particular, before using the same image sensor 1, to carry out the electrical connection operation of the logic unit 41 of each of the pixels 4 and at least a logic unit 41 of at least an adjacent pixel (or less) by means of closing the switching element 6 interposed between such logic units 41.

Part of the invention is also the method of detecting one or more photons F by means of the image sensor 1 which provides to output, by each of the logic units 41 of each of the pixels 4, the aforesaid electric signal S when the avalanche photodiode 42 belonging to the same pixel 4 of the logic unit 41 and a predefined minimum number of avalanche photodiodes 42 belonging to the adjacent pixels 4 each detect at least a photon F within the aforesaid time window $W_T$.

On the basis of the foregoing, therefore, the image sensor 1 of the invention reaches all the prefixed objects.

In particular, the object of realising an image sensor capable to ensure a spatial resolution higher than the image sensors of the known art, being the physical dimensions of the sensitive surfaces of the same image sensors equal, is reached.

The object of realising an image sensor with a high spatial resolution and at the same time of simple construction and management, being able to relate photon arrivals in a time window is also reached.

The invention claimed is:

1. A solid-state image sensor for detecting one or more photons, of the type comprising a plurality of pixels sensitive to said photons, each of said pixels comprising a logic unit and an single photon avalanche diode operatively connected to said logic unit, said logic unit of each of said pixels being operatively connected to the logic unit of at least an adjacent pixel, said logic unit of each pixel being configured to output an electrical signal relative to the captured information by the same pixel to said image sensor through a specific output channel, said electrical signal being different from the electrical signals provided by the logic units of the remaining pixels, said logic unit of each of said pixels outputting said electric signal when said single photon avalanche diode belonging to the same pixel and the single photon avalanche diode belonging to said at least an adjacent pixel each detect at least one of said photons within a time window, said time window starting when at least a photon is detected by said pixel, wherein said electrical signal output by said logic unit of each of said pixels contains information relating to the arrival time of the photon detected by said single photon avalanche diode belonging to the same pixel of said logic unit.

2. The image sensor according to claim 1, wherein said plurality of pixels is arranged as an array such to define a plurality of columns along a first direction X and/or a plurality of lines along a second direction Y.

3. The image sensor according to claim 2, wherein said logic unit of each of said pixels is operatively connected to the logic units of a plurality of pixels adjacent to said pixel which said logic unit belongs to.

4. The image sensor according to claim 1, wherein the operative connection of said logic unit of each of said pixels with said logic unit of said at least an adjacent pixel is defined by means of a conductive track and a switching element configured to electrically connect or electrically disconnect said logic units.

5. The image sensor according to claim 4, wherein said logic unit of each of said pixels is operatively connected to each logic unit of all the remaining pixels belonging to said image sensor by means of a conductive track and a switching element configured to electrically connect or electrically disconnect said logic units.

6. The image sensor according to claim 1, wherein said logic unit of each of said pixels is configured to output said electrical signal when the number of pixels, operatively connected by means of its own logic units to said logic unit of said pixel, which detect at least a photon within said time window, is higher than or equal to a predefined number.

7. A method for managing a solid-state image sensor for detecting one or more photons according to claim 4, wherein said method provides the operation of electrically connecting the logic unit of each of said pixels and at least a logic unit of at least an adjacent pixel by closing said switching element interposed between the aforesaid logic units.

8. The method for detecting one or more photons by means of a solid-state image sensor according to claim 1, wherein said method provides the operation of outputting said electrical signal by each logic unit of each of said pixels when said single photon avalanche diode belonging to the same pixel of said logic unit and the single photon avalanche diode belonging to said at least an adjacent pixel each detect at least a photon within a time window, said time window starting when at least a photon is detected by said pixel.

9. A solid-state image sensor for detecting one or more photons, of the type comprising a plurality of pixels sensitive to said photons, each of said pixels comprising a logic unit and an single photon avalanche diode operatively connected to said logic unit, said logic unit of each of said pixels being operatively connected to the logic unit of at least an adjacent pixel, said logic unit of each pixel being configured to output an electrical signal relative to the captured information by the same pixel to said image sensor through a specific output channel, said electrical signal being different from the electrical signals provided by the logic units of the remaining pixels, said logic unit of each of said pixels outputting said electric signal when said single photon avalanche diode belonging to the same pixel and the single photon avalanche diode belonging to said at least an adjacent pixel each detect at least one of said photons within a time window, said time window starting when at least a photon is detected by said pixel, wherein said electrical signal output by said logic unit of each of said pixels contains the arrival time of the photon detected by said single photon avalanche diode belonging to the same pixel of said logic unit.

* * * * *